United States Patent
Preston et al.

(10) Patent No.: US 6,759,688 B2
(45) Date of Patent: Jul. 6, 2004

(54) MONOLITHIC SURFACE MOUNT OPTOELECTRONIC DEVICE AND METHOD FOR FABRICATING THE DEVICE

(75) Inventors: Robert J. Preston, Windham, NH (US); James Hayner, Andover, MA (US)

(73) Assignee: Microsemi Microwave Products, Inc., Lowell, MA (US)

(*) Notice: Subject to any disclaimer, the term of this patent is extended or adjusted under 35 U.S.C. 154(b) by 0 days.

(21) Appl. No.: 10/068,778

(22) Filed: Feb. 5, 2002

(65) Prior Publication Data

US 2003/0094605 A1 May 22, 2003

Related U.S. Application Data

(60) Provisional application No. 60/332,146, filed on Nov. 21, 2001.

(51) Int. Cl.[7] .............................................. H01L 33/00
(52) U.S. Cl. ...................... 257/98; 313/502; 313/512
(58) Field of Search .......................... 257/98; 367/8; 313/498, 499, 502, 512

(56) References Cited

U.S. PATENT DOCUMENTS

| | | | |
|---|---|---|---|
| 5,216,805 A | * | 6/1993 | Hallenbeck et al. .......... 29/840 |
| 5,910,687 A | | 6/1999 | Chen et al. |
| 5,952,898 A | * | 9/1999 | Nakata et al. ................ 257/98 |
| 6,084,250 A | * | 7/2000 | Justel et al. .................. 257/89 |
| 6,187,611 B1 | | 2/2001 | Preston et al. |
| 6,265,289 B1 | | 7/2001 | Zheleva et al. |
| 6,326,645 B1 | * | 12/2001 | Kadota ......................... 257/94 |
| 6,509,579 B2 | * | 1/2003 | Takeya et al. ................ 257/22 |

OTHER PUBLICATIONS

P. Van Zant, *Microchip Fabrication*, 3rd Edition pp. 191–309 (1997).

* cited by examiner

*Primary Examiner*—Douglas Wille
(74) *Attorney, Agent, or Firm*—Gerald T. Bodner

(57) ABSTRACT

A monolithic surface mount optoelectronic device includes a transparent epoxy layer and a glass layer, which cover the active surface of a light emitting diode junction. The diode junction preferably outputs a characteristic wavelength of about 450 nm (blue light). The junction is fabricated by growing a P+ layer, gallium nitride layer, and a silicon gallium nitride buffer layer on a silicon substrate. The buffer layer, which is preferably non-conductive, is made conductive by the addition of a metallic shorting ring connecting the gallium nitride layer through a via in the silicon substrate to one of two surface mount contacts. A conductive beam connects the P+ layer to the remaining surface mount contact through another via in the silicon substrate. An isolation trench separates the vias in the substrate.

35 Claims, 12 Drawing Sheets

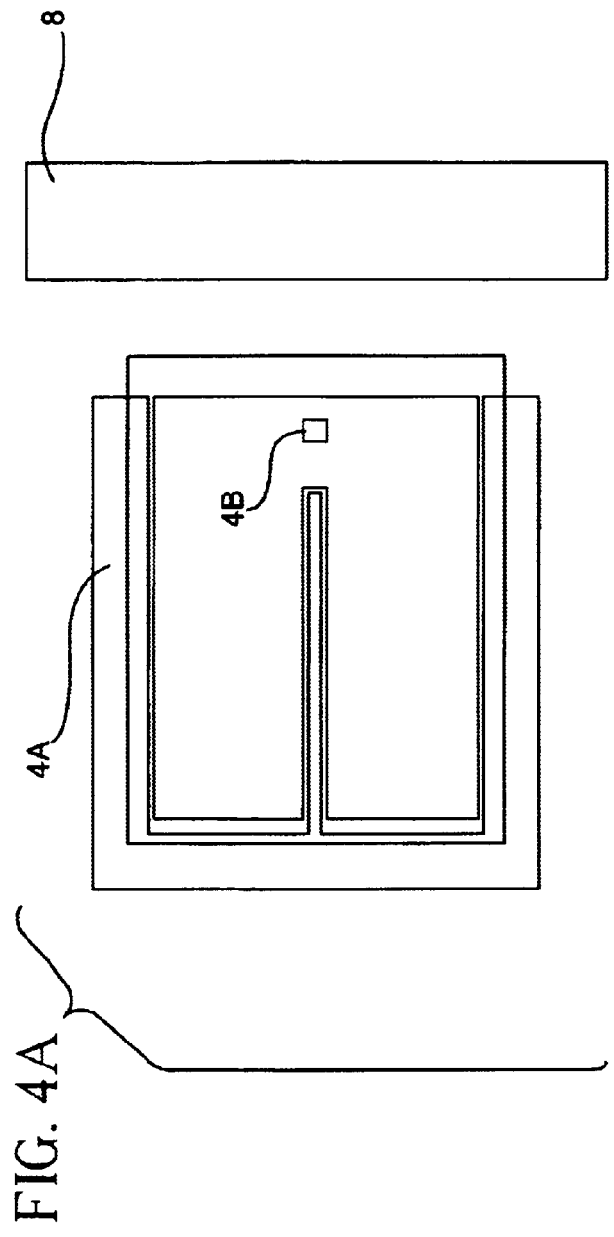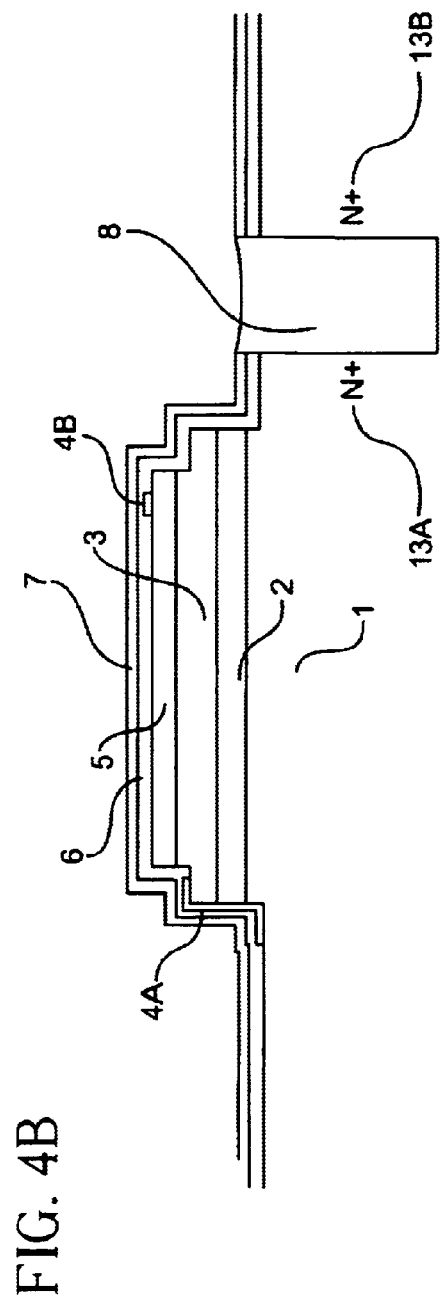
FIG. 4A
FIG. 4B

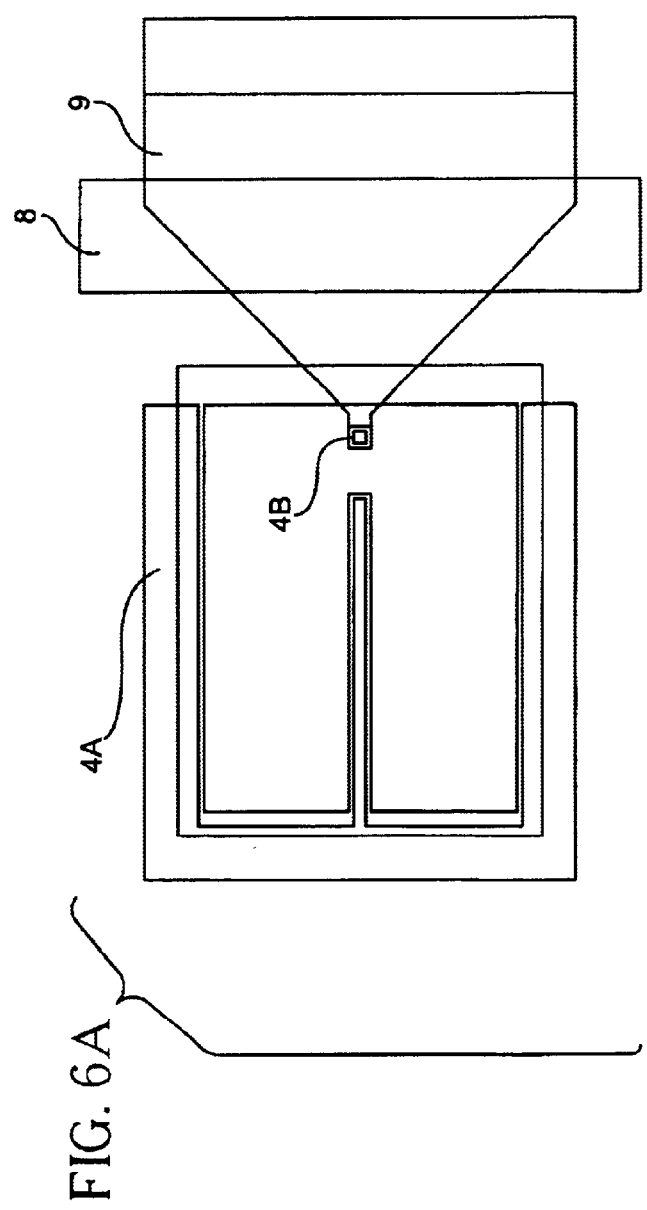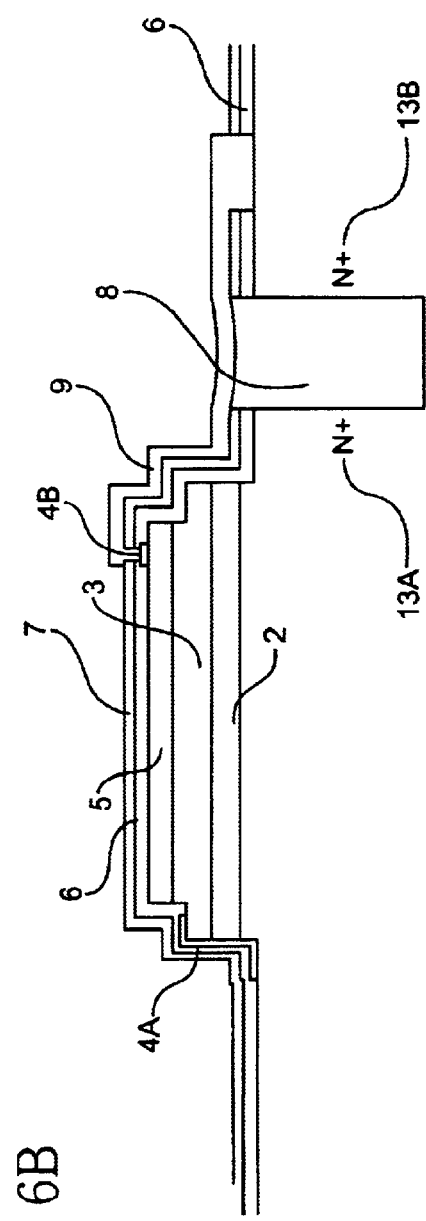
FIG. 6A
FIG. 6B

MONOLITHIC SURFACE MOUNT OPTOELECTRONIC DEVICE AND METHOD FOR FABRICATING THE DEVICE

CROSS-REFERENCE TO RELATED APPLICATION

This application claims the benefit of U.S. Provisional Application No. 60/332,146, filed Nov. 21, 2001, which is incorporated herein by reference.

BACKGROUND OF THE INVENTION

1. Field of the Invention

The present invention relates generally to semiconductor devices, and more particularly to a monolithic surface mount semiconductor optoelectronic device and fabrication method.

2. Description of the Prior Art

Some of the main issues driving component packaging today include thermal and electrical performance, real estate constraints (i.e., package size), and manufacturing cost. With integrated circuit (IC) geometry shrinking well into the sub-micron level, and operating frequencies in the gigahertz range, attention has focused on the evolution of advanced packaging technologies to address the numerous issues now plaguing diode, transistor, and IC designers. Ranging from thermal problems, to parasitic interference, to inductive losses, these issues have created a technological bottleneck, which has made packaging technology a crucial concern.

One of the basic limitations of semiconductor devices is the dissipation of heat that is generated during operation of the device. This heat must be transferred to a thermal sink without causing an excessive temperature rise within the device, which may cause partial or total device failure, and generally degrade the overall reliability of the device. The ability to dissipate heat places an upper bound on the maximum allowable power dissipation or ambient temperature range of operation for the device.

Where speed or power dissipation is not an issue, conventional plastic packages e.g., dual-in-line, surface mount, etc., which are typically non-hermetic and made of injection-molded epoxy compounds, are employed in the semiconductor industry due to their low cost. Plastic packages, however, inherently have higher parasitic capacitance and lower thermal conductivity, compared to other package types. Furthermore, conventional plastic package performance falls off or becomes widely erratic at higher frequencies (typically exceeding 1 gigahertz) due, at least in part, to variations in package parasitics (i.e., parasitic capacitance and inductance) from device to device. These and other disadvantages make standard plastic packages unsuitable for applications requiring high speed and high power dissipation.

Historically, where high speed and/or high power dissipation was a critical design requirement, expensive ceramic or metal can packages have been used, which generally exhibit lower parasitic capacitance, higher thermal conductivity, and greater mechanical strength than plastic packages. Aside from a substantially increased cost over standard plastic packages, ceramic and metal packages have an additional disadvantage of being bulkier than their plastic counterparts (i.e., larger in size) which is a detriment where circuit board real estate is scarce. Additionally, bonding wires, which connect the bond pads of the semiconductor device to the package pins, add series inductance, which significantly degrades the high frequency performance of the device.

Driven by the need for smaller consumer products and lower manufacturing costs, the trend has been to shrink the die and package size of circuit components. This is most evident, for example, in the cellular telephone market, which has recently pushed operating frequencies into the gigahertz range while concurrently shrinking the product size to easily fit in a shirt pocket. Because integrated circuit technology has resulted in increased functionality, enabling more circuit elements to be fabricated on the same semiconductor die, more heat is generated per unit volume within a smaller package footprint. Higher clock frequencies have further challenged the heat dissipation and speed capability of conventional package designs.

Although some heat generated by the semiconductor die is conveyed to the outside of the device package through the mold compound, the primary heat flow paths for a standard leadframe package are through the package leads themselves, which are typically made of copper. Unfortunately, conventional package leads and bond wires add significant amounts of parasitic inductance to the circuit. Although the length of the bond wires may be less for smaller package arrangements, the parasitic inductance associated with these bond wires is still significant at such frequencies, for example, in the gigahertz range. Therefore, high frequency performance remains substantially impaired. High-speed performance, high power dissipation, and small package size represent conflicting design requirements. Thus far, conventional integrated circuit packaging technology has failed to concurrently fulfill these important characteristics.

There are various other problems associated with conventional packaging technologies. For example, dwindling printed circuit board space has pressured semiconductor manufacturers to produce components having a smaller footprint (i.e., external package dimensions). Furthermore, quality, performance, reliability problems, and costly delays associated with offshore manufacturing e.g., assembly and packaging are additional concerns that prior art packaging technologies have failed to alleviate.

Substrates based on silicon carbide or sapphire provide good thermal conductivity, which is a significant aid in dissipating excessive heat away from the pn junction in an optoelectronic device, such as a light emitting diode (LED). However, sapphire wafers cost about $400 and silicon carbide wafers cost about $800.

In addition, the forward biased voltage requirement (Vf) for silicon carbide and sapphire substrates is nearly 4.0 volts. This voltage is difficult to supply in portable battery operated devices, such as handheld phones that only provide a maximum of about 3.9 volts when fully charged.

By focusing on only a single specific design problem, rather than addressing multiple problems simultaneously, prior art packaging technologies have exacerbated other equally crucial problems. Accordingly, there remains a need for a monolithic optoelectronic device integrated into a packaging arrangement that, among other things, is capable of high frequency operation, that can more readily dissipate the heat generated by the integrated circuit, that is smaller in physical size, that utilizes conventional semiconductor fabrication technology, that has modest voltage requirements, and that has a relatively low manufacturing cost.

OBJECTS AND SUMMARY OF THE INVENTION

It is an object of the present invention to provide a monolithic semiconductor device and method for fabricating the device that utilizes gallium nitride on a silicon substrate, which is more cost-effective than devices using either sapphire or silicon carbide substrates.

It is another object of the present invention to provide a monolithic semiconductor device and method for fabricating the device on larger substrates, such as those that are about 6–10 inches in diameter.

It is yet another object of the present invention to provide a monolithic semiconductor device and method for fabricating the device using packaging technology that overcomes inherent thermal conductivity problems by reducing a silicon substrate to a very thin layer of about 25–50 $\mu$m.

It is still another object of the present invention to provide a monolithic semiconductor device and method for fabricating the device that is beneficial in battery powered devices by reducing the forward bias voltage requirements of light emitting diodes fabricated thereon.

It is a further object of the present invention to provide a monolithic semiconductor device and method for fabricating the device that is suitable for monolithic wafer level packaging, which is less expensive and more reliable than conventional metal ceramic packaging.

It is still a further object of the present invention to provide a monolithic semiconductor device and method for fabricating the device that enables on-wafer final testing and mapping for light output, which substantially reduces the overall cost of testing optoelectronic devices.

It is yet a further object of the present invention to provide a monolithic semiconductor device and method for fabricating the device that provides about 90–97% light transmission at a wavelength of about 450 nm, which is significantly more efficient than metal ceramic or epoxy packaging.

It is another object of the present invention to provide a monolithic semiconductor device and method for fabricating the device that enables simple phosphor coatings to be used to mix red, green, and blue light to make white light for use in liquid crystal displays.

A monolithic surface mount semiconductor process described in U.S. Pat. No. 6,187,611, which is incorporated herein by reference, is used to fabricate an optoelectronic device. A transparent epoxy layer and a glass layer offer excellent optical transmission characteristics and are used to cover the active surface of the optoelectronic device. The heat dissipation properties of the package, which are provided by thinned silicon vias, are advantageous for LED (light emitting diode) fabrication.

Prior art packaging technologies for conventional optoelectronic devices utilize wire bonding and die attach soldering of a chip into metal ceramic packages with some form of window or lens to enable the transmission of light outside the package. This process is relatively costly and has inherent reliability issues.

The subject invention utilizes an LED junction device that preferably outputs a characteristic wavelength of about 450 nm (blue light). The device is fabricated by growing a P+ layer, gallium nitride (GaN) layer, and a silicon (Si) GaN buffer layer on a 1:1:1 orientation silicon substrate. The buffer layer, which is preferably non-conductive, is made conductive by the addition of a metallic shorting ring connecting the gallium nitride layer through the N+ silicon substrate to one of two surface mount contacts. A conductive beam connects the buffer layer to the remaining surface mount contact via the N+ silicon substrate.

BRIEF DESCRIPTION OF THE DRAWING

FIGS. 1a–8a are top views of a preferred processing sequence for fabricating a gallium nitride (GaN) light emitting diode (LED) in accordance with the present invention;

FIGS. 1b–8b are side cross-sectional views of the preferred processing sequence for fabricating a gallium nitride (GaN) light emitting diode (LED) in accordance with the present invention;

DETAILED DESCRIPTION OF THE PREFERRED EMBODIMENTS

The following description summarizes a preferred processing sequence for fabricating a gallium nitride (GaN) light emitting diode (LED) using a packaging method in accordance with the present invention. The sequence is shown in FIGS. 1–8.

A detailed discussion of a conventional photolithography fabrication process, suitable for use with the present invention, is provided in such texts as S. Wolf and R. Tauber, *Silicon Processing for the VLSI Era*, Lattice Press, (1986); P. Allen and D. Holberg, *CMOS Analog Circuit Design*, Holt, Rinehart, and Winston (1987); and A. Grebene, *Bipolar and MOS Analog Integrated Circuit Design*, John Wiley & Sons, (1984). These texts are incorporated herein by reference. Consequently, only a cursory discussion of the semiconductor fabrication process is presented below to more clearly describe the novel features and advantages of the present invention.

Figure 1A:
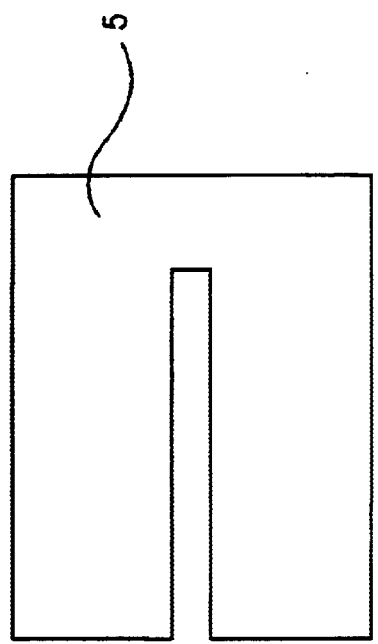
Figure 1B:
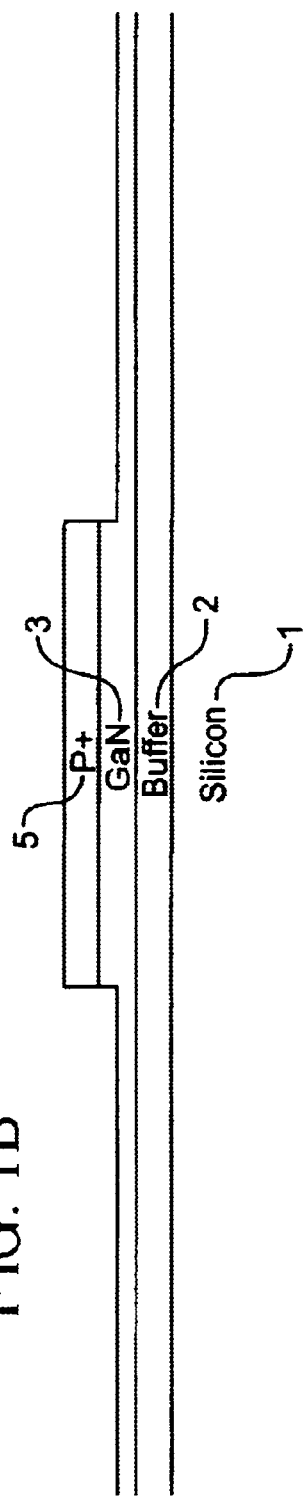

FIGS. 1a and 1b are top and side cross-sectional views, respectively, of a device layer epitaxy phase. In the device layer epitaxy phase, a buffer layer 2 is preferably grown on an N+ silicon substrate 1 using epitaxial depositions. A GaN layer 3 is then preferably deposited on the buffer layer 2 and a P+ layer 5 is preferably deposited on the GaN layer 3 to form, for instance, an active pn junction for the LED.

The P+ layer 5 and the GaN layer 3 are then preferably etched to isolate the pn junction. This isolation also provides a stepped surface 15, as shown in FIG. 2b, on which a metallic shorting ring 4a is preferably deposited, as shown in FIG. 3b. The metallic shorting ring 4A preferably connects the GaN layer 3 to the N+ silicon substrate 1.

Figure 2A:
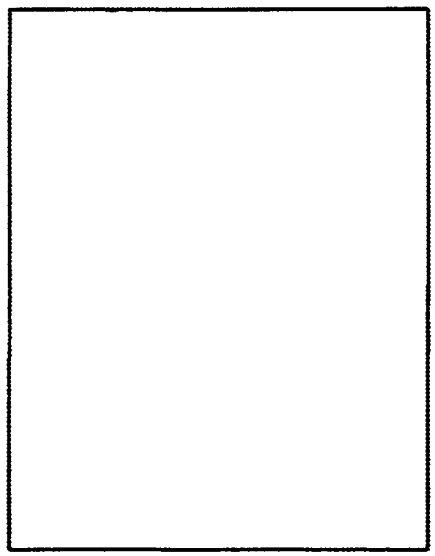
Figure 2B:
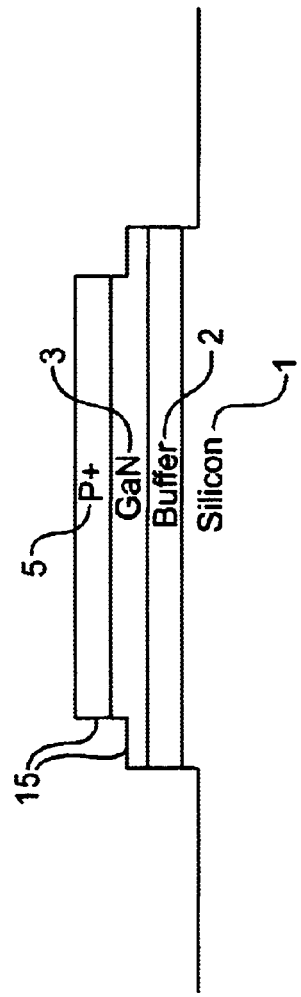

FIGS. 2a and 2b are top and side cross-sectional views, respectively, of a device etch phase. In this phase, the device is preferably etched with either plasma or chemicals to isolate the pn junction and to enable deposition of the metallic shorting ring 4A shown in FIG. 3b.

Figure 3A:
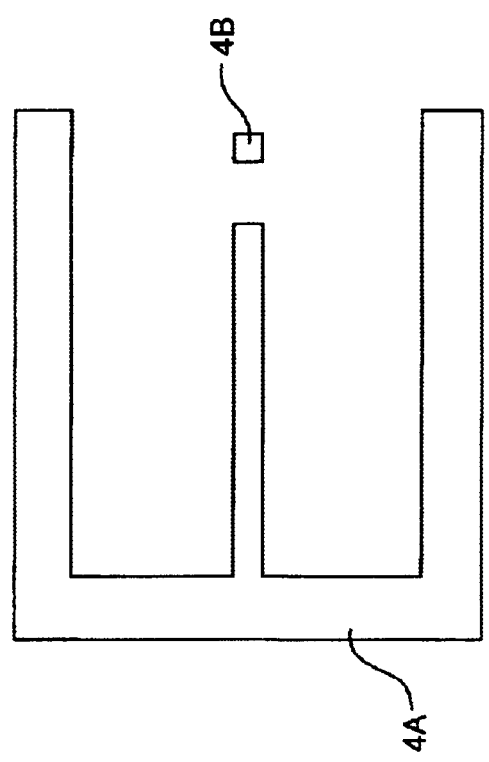
Figure 3B:
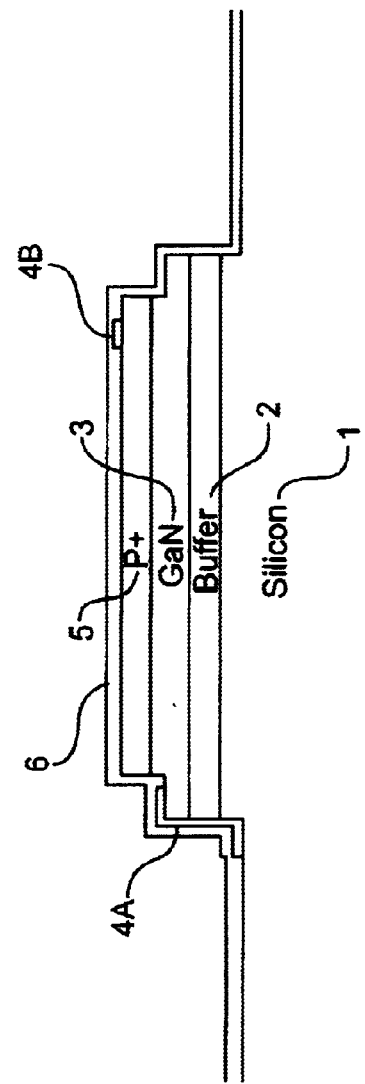

FIGS. 3a and 3b are top and side cross-sectional views, respectively, of a contact metalization phase. In the contact metallization phase, the metallic shorting ring 4A and a P+ contact metal 4B are preferably simultaneously vacuum deposited and chemically etched to the desired pattern. The metallic shorting ring 4A is preferably deposited on the stepped surface 15 and the P+ contact metal 4B is preferably deposited on the P+ layer 5. In addition, an oxide passivation layer 6 is deposited over the entire device in this phase.

FIGS. 4a and 4b are top and side cross-sectional views, respectively, of a trench etch-and-fill phase. In this phase, a nitride passivation layer 7 is deposited over the entire device and an isolation trench 8 is formed and preferably filled with a Zinc (zinc)-Boro (boron) Alumina (aluminum) glass slurry.

The device is then preferably fired in a furnace to planarize and isolate a first N+ via 13A from a second N+ via 13B laterally with respect to either side of the isolation trench 8. The sides of the isolation trench 8 are preferably fabricated to be at about a 90° angle with respect to a bottom surface of the silicon substrate 1, but may alternatively be at some other angle, such as 52°.

Figure 5A:
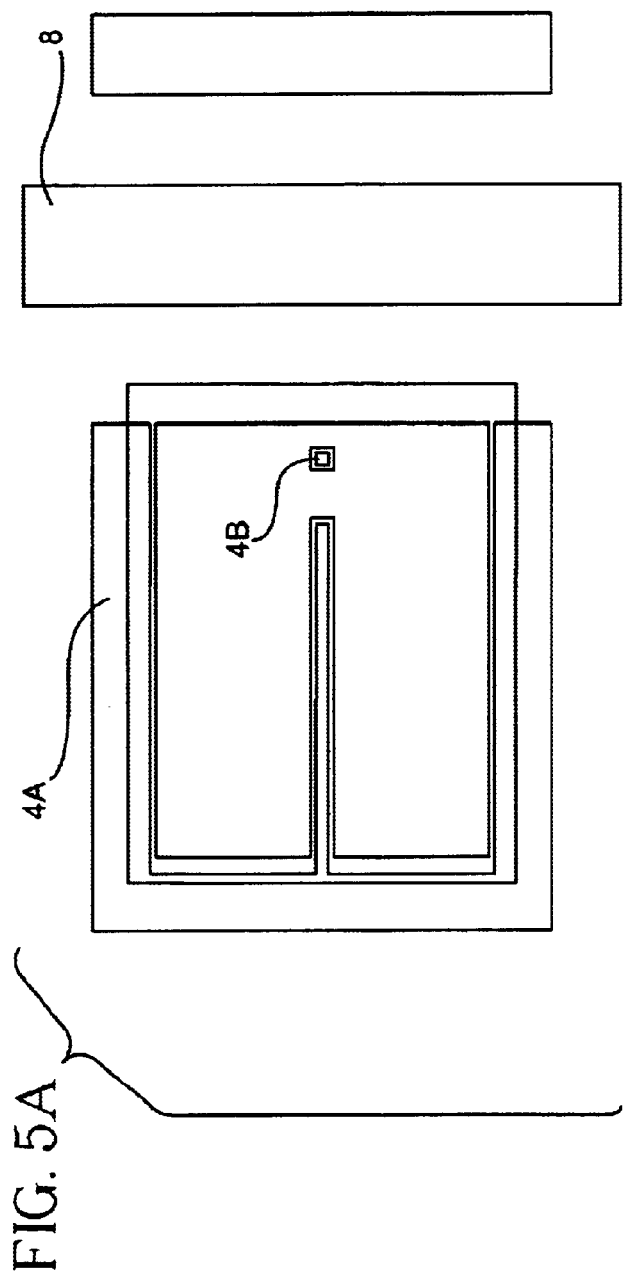
Figure 5B:
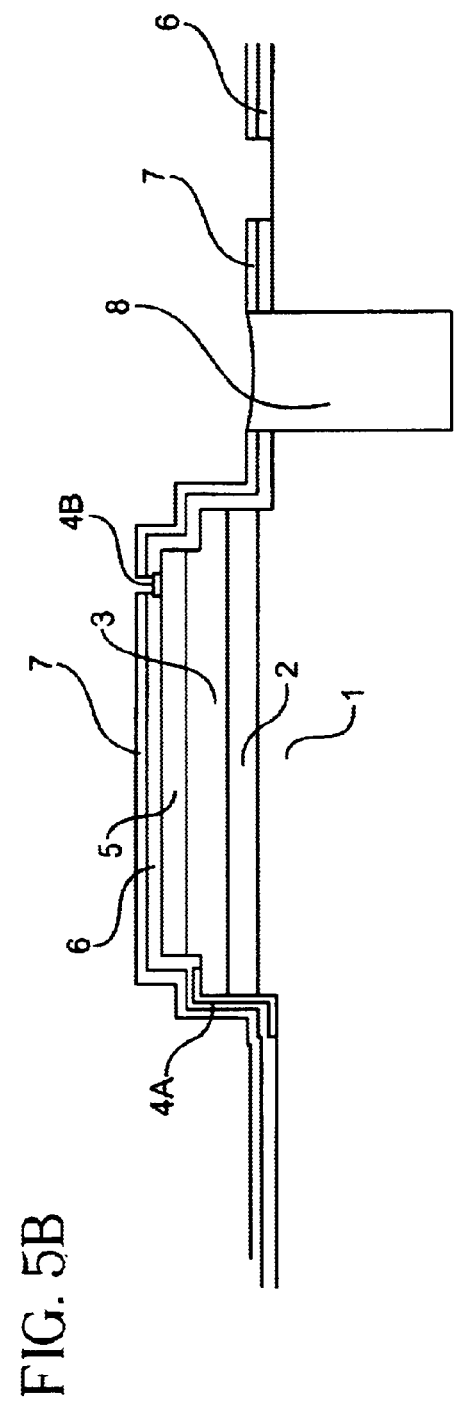

FIGS. 5a and 5b are top and side cross-sectional views, respectively, of a contact window formation phase. In this phase, the window is preferably plasma etched through the oxide passivation layer 6 and the nitride passivation layer 7.

FIGS. 6a and 6b are top and side cross-sectional views, respectively, of a beam mask-and-plate phase. In this phase, an interconnecting gold beam 9 is preferably vacuum deposited, electrolytically plated, and pattern etched to connect the P+ contact metal 4B to the first N+ via 13A.

Figure 7A:
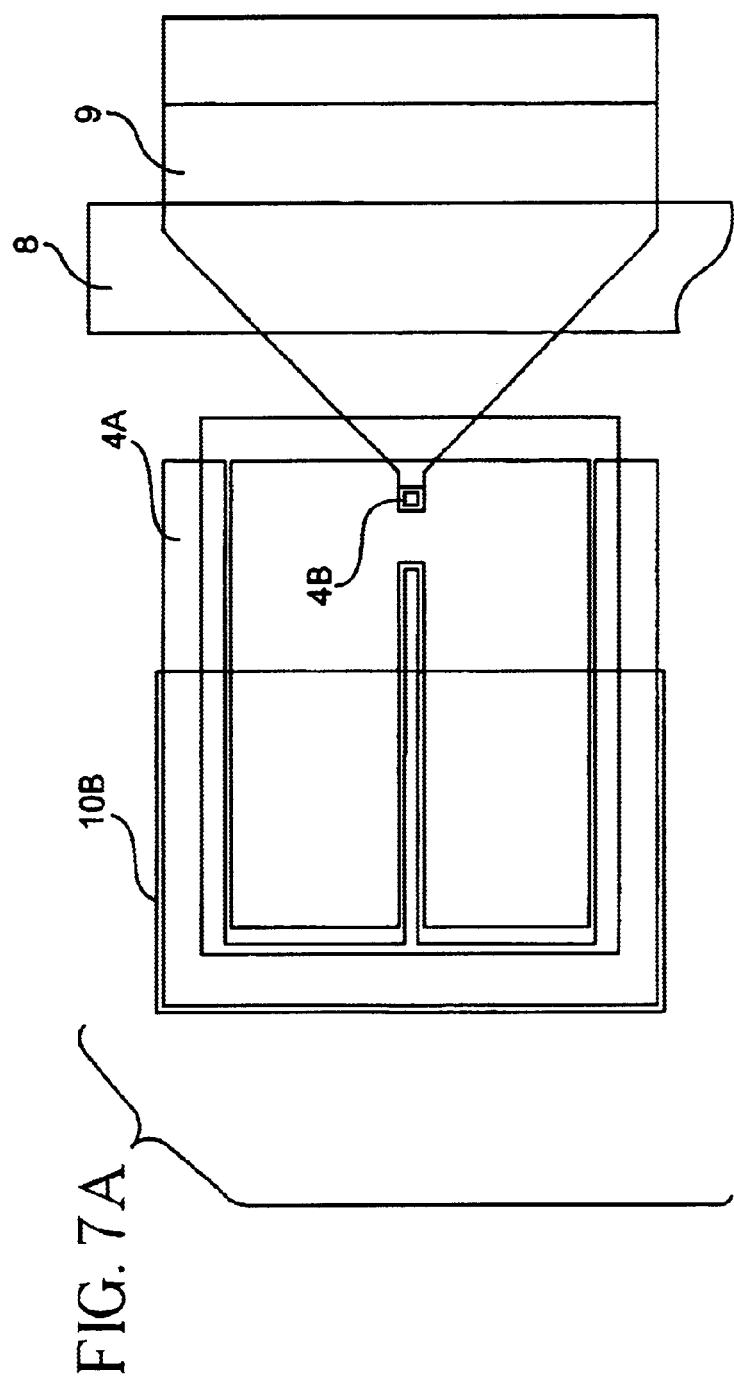
Figure 7B:
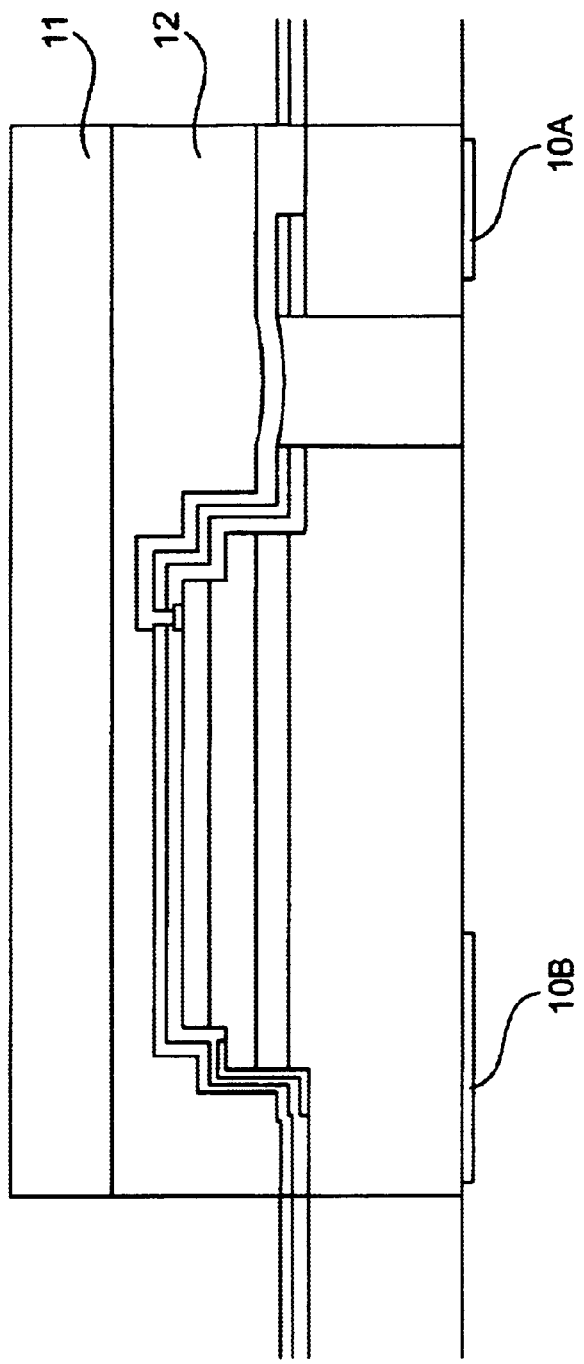

FIGS. 7a and 7b are top and side cross-sectional views, respectively, of a cover bond formation and wafer-thinning phase. In this phase, a glass cover wafer 11 is preferably bonded to the device wafer using an ultraviolet curable epoxy 12. In addition, the silicon side of the wafer is ground and polished so that the remaining silicon is preferably about 25–50 µm in thickness, which exposes the glass filled trench 8.

Figure 8A:
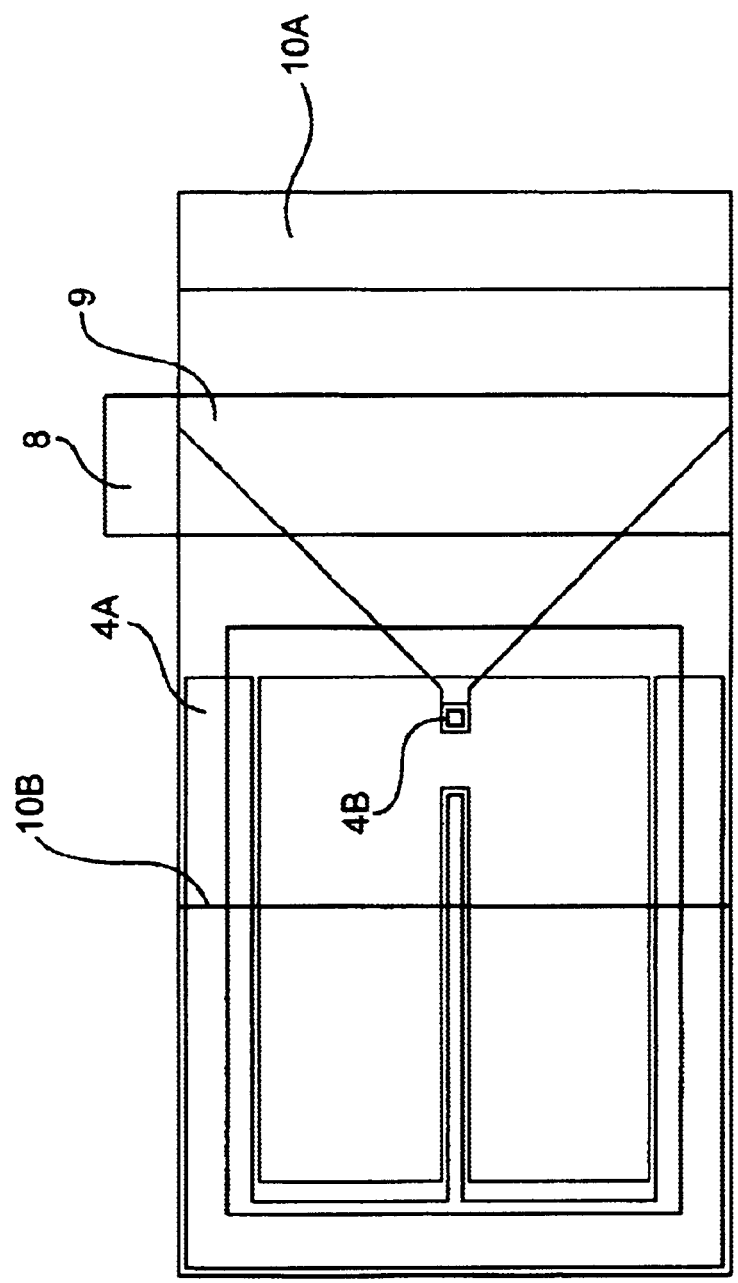
Figure 8B:
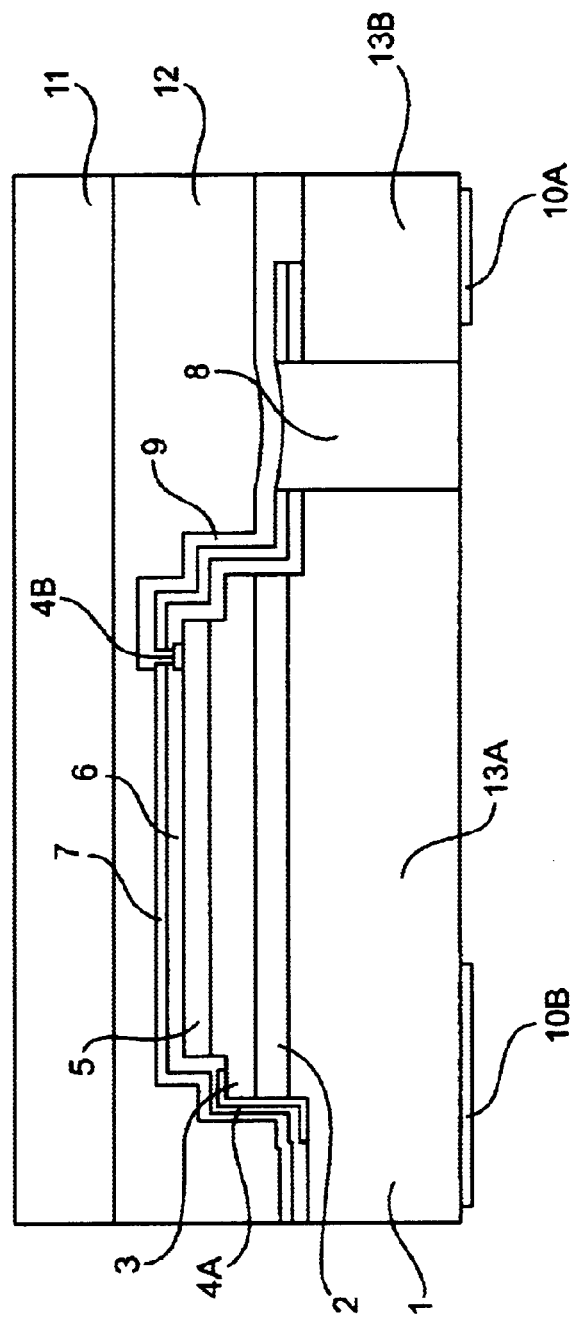

FIGS. 8a and 8b are top and side cross-sectional views, respectively, of a back contact formation and device separation phase. In this phase, the back contacts 10a and 10b, which are preferably Ti (titanium), Pt (platinum), and Au (gold) metalizations, are deposited. The wafer is then diced using a high-speed dicing saw to form individual packaged devices.

Figure 9:
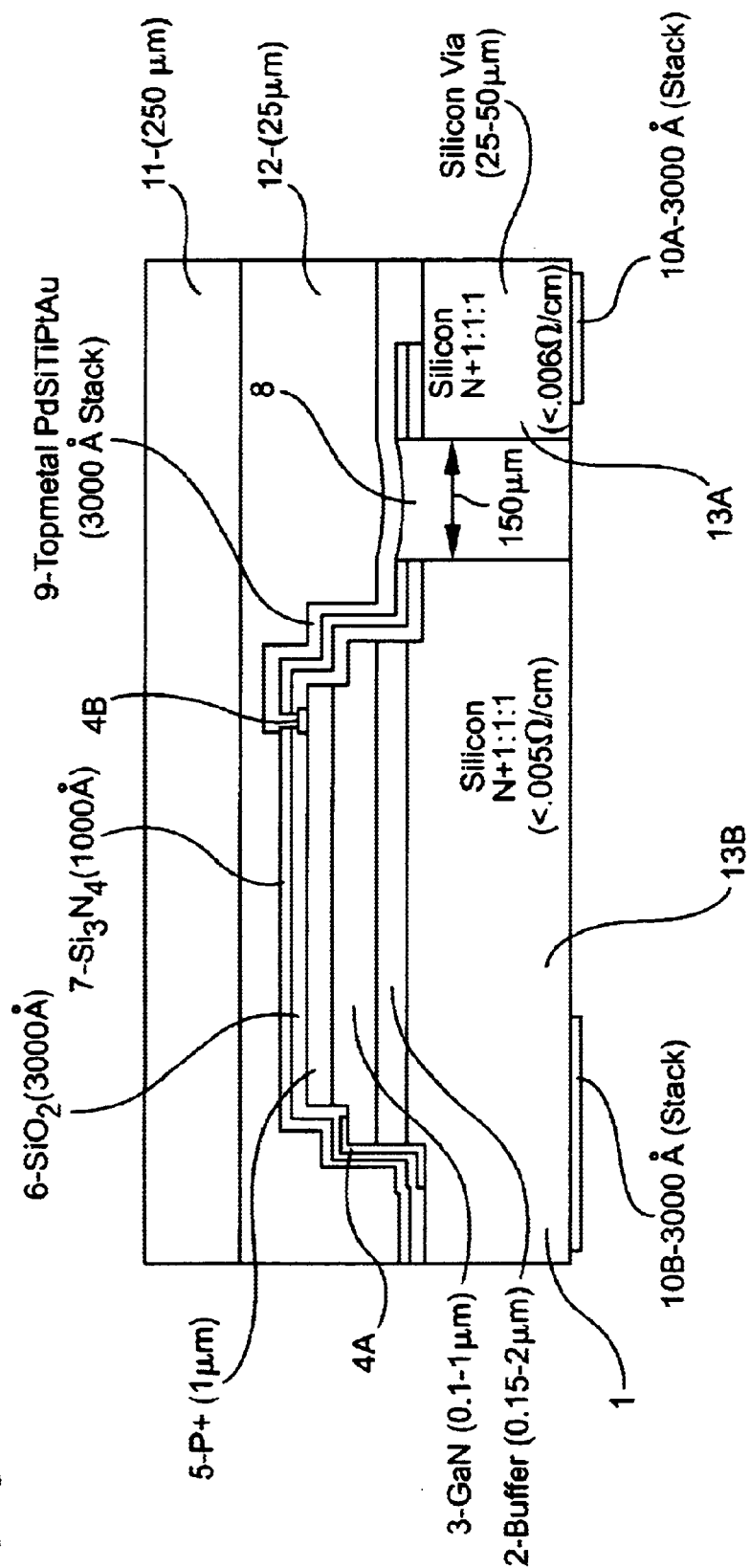
FIG. 9 is the side cross-sectional view of the GaN LED shown in FIG. 8b showing a preferred set of dimensions for the layers.

The following list summarizes some of the advantages of the semiconductor device and method formed in accordance with the present invention:

1. Gallium nitride on a silicon substrate provides a significantly more cost-effective integrated device, since silicon substrates are about 10 times cheaper than substrates made from sapphire or silicon carbide.
2. Gallium nitride may be fabricated on larger silicon wafers, such as about 6–10 inches in diameter, rather than about 3–4 inch diameter sapphire or silicon carbide wafers.
3. The packaging technology formed in accordance with the present invention solves an inherent problem with using silicon substrates, which is thermal conductivity, since the silicon may be reduced to very thin layers of about 25–50 µm.
4. Gallium nitride on silicon light emitting diodes provide for lower forward bias voltage requirements (Vf=3.2V) when compared with those requirement for gallium nitride on sapphire or silicon carbide substrates (Vf=3.5–3.7V). This provides a significant advantage when integrating devices formed in accordance with the present invention in battery powered portable devices.
5. Prior art requires that light emitting diode chips be packaged in metal ceramic packages. This separate packaging operation is more expensive and less reliable than monolithic wafer level packaging, which is made possible by the method of the present invention.
6. Wafer level packaging in accordance with the subject invention allows for on-wafer final testing and mapping for light output, which substantially reduces testing costs.
7. The optical quality of the glass cover wafer 11 provides for about 90–97% light transmission at wavelengths of about 450 nm, which is significantly more efficient than metal ceramic or epoxy packaging.
8. The glass cover facilitates the use of simple phosphor coatings attached to the device, which enable the mixing of red, green, and blue light to provide white light for use with liquid crystal displays and solid-state light bulbs. FIG. 9 shows a preferred set of dimensions and characteristics for the layers in the gallium nitride light emitting diode shown in FIG. 8b. The layers and their preferred dimensions and characteristics are as follows:

silicon substrate 1: <0.005 ohms/cm and about 25–50 µm in thickness;

buffer layer 2: about 0.15–2 µm in thickness;

gallium nitride layer 3: about 0.1–1 µm in thickness;

P+ layer 5: about 0.1–1 µm in thickness;

oxide ($SiO_2$) passivation layer 6: about 3000 Å in thickness;

nitride ($Si_3N_4$) passivation layer 7: about 1000 Å in thickness;

isolation trench 8: about 150 µm in width;

interconnecting beam 9: about 3000 Å in thickness (height of stacked layers);

TiPtAu contact metalizations 10A, 10B—about 3000 Å in thickness (height of stacked layers);

glass cover layer 11: about 250 µm in thickness; and ultraviolet curable epoxy layer 12: about 12–25 µm in thickness.

Figure 10:
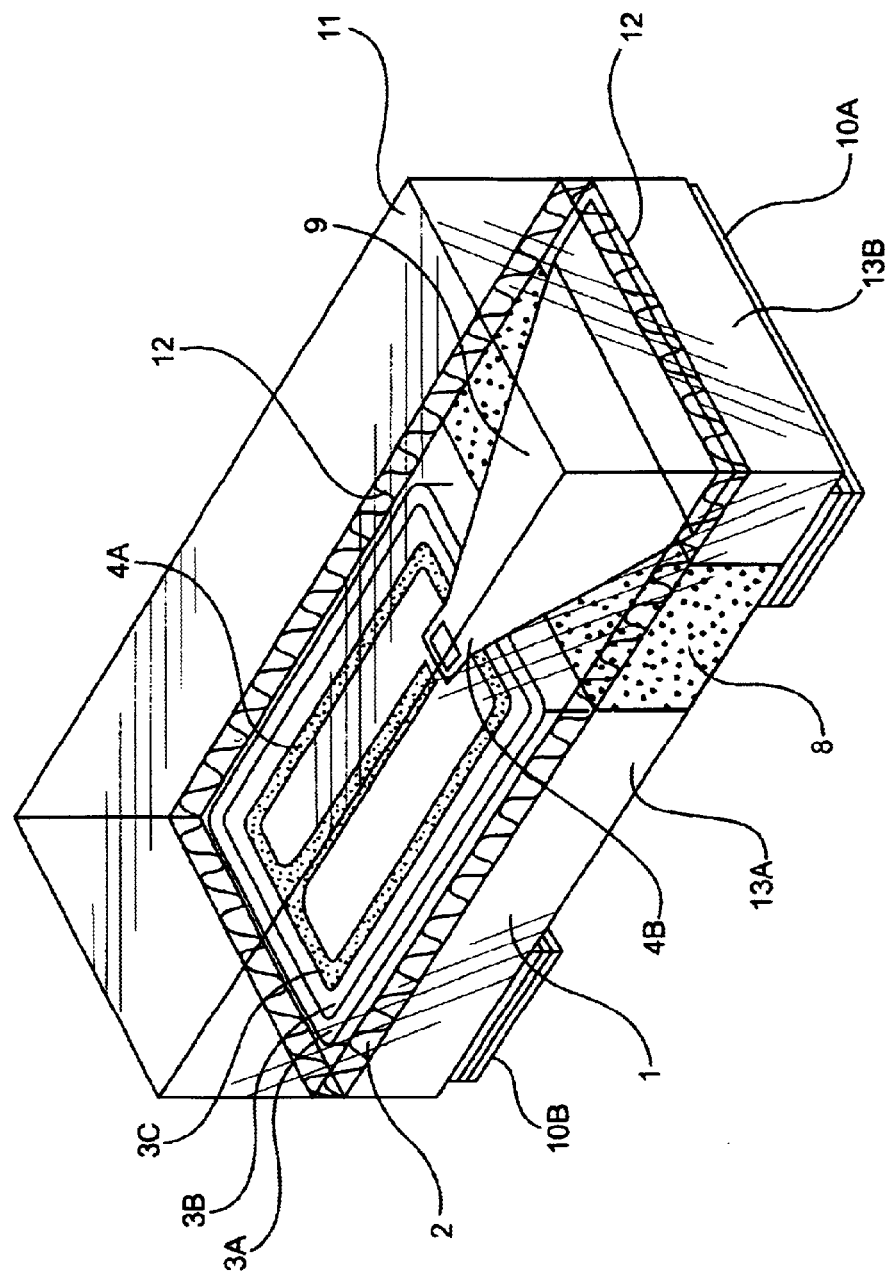
FIG. 10 is an orthogonal view of an LED formed in accordance with the present invention.

FIG. 10 is an orthogonal view of a light emitting diode formed in accordance with the present invention having the following layers:

N+ silicon substrate 1;

buffer layer 2 between silicon substrate 1 and gallium nitride layers 3;

gallium nitride N+ layer 3A;

gallium nitride N– layer 3B;

gallium nitride P+ layer 3C;

Ti—Pt—Au metallization layer (periphery is preferably thick plated Au) 4A;

window through passivation layers to P+ contact 4B;

Ti—Pt—Au metallization interconnecting lead 9;

cathode via (first N+ silicon via 13A) to connect backside contact 10A;

anode via (second N+ silicon via 13B) to connect backside contact 10B;

glass filled isolation trench 8;

glass package cover 11 ultraviolet curable epoxy adhesive 12;

Ti—Pt—Au anode contact 10A; and

Ti—Pt—Au cathode contact 10B.

The top surface of the isolation trench is preferably concave as shown in FIGS. 1–8, but may alternatively be substantially flat as shown in FIG. 10.

Thus, a monolithic semiconductor device and method for fabricating the device in accordance with the present invention utilizes gallium nitride on a silicon substrate, which is more cost-effective than devices using sapphire or silicon carbide substrates. In addition, the device may be fabricated on larger substrates, such as those that are about 6–10 inches in diameter.

Packaging technology in accordance with the method of the present invention overcomes inherent thermal conductivity problems by reducing the silicon substrate to a very thin layer of about 25–50 µm. This technology is also beneficial for integration in battery powered devices by reducing the forward bias voltage requirements of light emitting diodes.

In addition, a monolithic semiconductor device and method for fabricating the device in accordance with the present invention is suitable for monolithic wafer level packaging, which is less expensive and more reliable than conventional metal ceramic packaging. The device and method enable on-wafer final testing and mapping for light output, which substantially reduces the overall cost of testing.

Further, a monolithic semiconductor device and method for fabricating the device in accordance with the present invention provides about 90–97% light transmission at a wavelength of about 450 nm, which is significantly more efficient than metal ceramic or epoxy packaging. The device and method also enable the application of simple phosphor coatings so that red, green, and blue light may be mixed to provide white light for use with liquid crystal displays.

Although the illustrative embodiments of the present invention have been described herein with reference to the accompanying drawing, it is to be understood that the invention is not limited to those precise embodiments and that various other changes and modifications may be effected therein by one skilled in the art without departing from the scope or spirit of the invention.

What is claimed is:

1. An optoelectronic device, which comprises:
   a semiconductor substrate, the semiconductor substrate including an active surface and a back surface, the back surface opposing the active surface;
   at least one light emitting diode junction, the at least one light emitting diode junction being formed on the semiconductor substrate;
   an ultraviolet-curable adhesive layer, the ultraviolet-curable adhesive layer being deposited on at least a portion of the active surface;
   at least one passivation layer, the at least one passivation layer being positioned between the semiconductor substrate and the ultraviolet-curable adhesive layer;
   an ultraviolet-transparent insulative layer, the ultraviolet-transparent insulative layer being positioned on the ultraviolet-curable adhesive layer, the ultraviolet-curable adhesive layer being cured by passing ultraviolet radiation through the ultraviolet-transparent insulative layer, the ultraviolet-curable adhesive layer bonding the ultraviolet-transparent insulative layer to at least a portion of the active layer in response to being cured; and
   electrically conductive material, the electrically conductive material being deposited on the back surface of the semiconductor substrate, the electrically conductive material forming at least one contact, the at least one contact being operatively connected to the at least one light emitting diode junction.

2. An optoelectronic device as defined by claim 1, wherein the at least one passivation layer includes silicon oxide (SiO2) and is about 3000 Å in thickness.

3. An optoelectronic device as defined by claim 1, wherein the at least one passivation layer includes silicon nitride (Si3N4) and is about 1000 Å in thickness.

4. An optoelectronic device, which comprises:
   a semiconductor substrate, the semiconductor substrate including an active surface and a back surface, the back surface opposing the active surface;
   at least one light emitting diode junction, the at least one light emitting diode junction being formed on the semiconductor substrate;
   an ultraviolet-curable adhesive layer, the ultraviolet-curable adhesive layer being deposited on at least a portion of the active surface;
   an isolation trench, the isolation trench being positioned in the active surface of the semiconductor substrate;
   an ultraviolet-transparent insulative layer, the ultraviolet-transparent insulative layer being positioned on the ultraviolet-curable adhesive layer, the ultraviolet-curable adhesive layer being cured by passing ultraviolet radiation through the ultraviolet-transparent insulative layer, the ultraviolet-curable adhesive layer bonding the ultraviolet-transparent insulative layer to at least a portion of the active layer in response to being cured; and
   electrically conductive material, the electrically conductive material being deposited on the back surface of the semiconductor substrate, the electrically conductive material forming at least one contact, the at least one contact being operatively connected to the at least one light emitting diode junction.

5. An optoelectronic device as defined by claim 4, wherein the semiconductor substrate is less than about 0.005 ohm-cm.

6. An optoelectronic device as defined by claim 4, wherein the semiconductor substrate is about 25–50 µm in thickness.

7. An optoelectronic device as defined by claim 4, further comprising a buffer layer, the buffer layer being positioned between the semiconductor substrate and the at least one light emitting diode junction.

8. An optoelectronic device as defined by claim 7, wherein the buffer layer includes silicon gallium nitride.

9. An optoelectronic device as defined by claim 7, wherein the buffer layer is about 0.15–2 µm in thickness.

10. An optoelectronic device as defined by claim 4, wherein the at least one light emitting diode junction includes a gallium nitride layer and a P+ layer.

11. An optoelectronic device as defined by claim 10, wherein the gallium nitride layer is about 0.1–1 µm in thickness.

12. An optoelectronic device as defined by claim 10, wherein the P+ layer is about 0.1–1 µm in thickness.

13. An optoelectronic device as defined by claim 4, wherein the isolation trench is filled with a glass slurry including at least one of zinc, boron, and aluminum.

14. An optoelectronic device as defined by claim 4, wherein the isolation trench includes sides, the sides being fabricated to be at least one of about 90° and 52° with respect to the back surface of the semiconductor surface.

15. An optoelectronic device as defined by claim 4, wherein the isolation trench is about 150 µm in width.

16. An optoelectronic device as defined by claim 4, wherein the semiconductor substrate includes a first N+ via and a second N+ via, the isolation trench being positioned between the first N+ via and the second N+ via.

17. An optoelectronic device as defined by claim 16, wherein the first N+ via is less than about 0.006 ohm-cm.

18. An optoelectronic device as defined by claim 16, wherein the second N+ via is less than about 0.005 ohm-cm.

19. An optoelectronic device as defined by claim 16, further comprising an interconnecting beam, the at least one light emitting diode junction including a P+ layer, the interconnecting beam operatively connecting the first N+ via of the semiconductor substrate to the P+ layer of the at least one light emitting diode junction.

20. An optoelectronic device as defined by claim 19, wherein the interconnecting beam is about 3000 Å in thickness.

21. An optoelectronic device as defined by claim 10, further comprising a P+ contact, the P+ contact being operatively connected to the P+ layer of the at least one light emitting diode junction.

22. An optoelectronic device, which comprises:
a semiconductor substrate, the semiconductor substrate including an active surface and a back surface, the back surface opposing the active surface;
at least one light emitting diode junction, the at least one light emitting diode junction being formed on the semiconductor substrate, the at least one light emitting diode junction including a gallium nitride layer and a P+ layer;
an ultraviolet-curable adhesive layer, the ultraviolet-curable adhesive layer being deposited on at least a portion of the active surface;
a shorting ring, the semiconductor substrate including an N+ via, the shorting ring operatively connecting the gallium nitride layer of the at least one light emitting diode junction to the N+ via of the semiconductor substrate;
an ultraviolet-transparent insulative layer, the ultraviolet-transparent insulative layer being positioned on the ultraviolet-curable adhesive layer, the ultraviolet-curable adhesive layer being cured by passing ultraviolet radiation through the ultraviolet-transparent insulative layer, the ultraviolet-curable adhesive layer bonding the ultraviolet-transparent insulative layer to at least a portion of the active layer in response to being cured; and
electrically conductive material, the electrically conductive material being deposited on the back surface of the semiconductor substrate, the electrically conductive material forming at least one contact, the at least one contact being operatively connected to the at least one light emitting diode junction.

23. An optoelectronic device as defined by claim 22, wherein the gallium nitride layer of the at least one light emitting diode junction includes a stepped surface, the shorting ring being deposited on the stepped surface.

24. An optoelectronic device as defined by claim 4, wherein the ultraviolet-transparent insulative layer includes glass.

25. An optoelectronic device as defined by claim 4, wherein the ultraviolet-transparent insulative layer is about 250 µm in thickness.

26. An optoelectronic device as defined by claim 4, wherein the ultraviolet-curable adhesive layer is about 12–25 µm in thickness.

27. An optoelectronic device as defined by claim 4, wherein the at least one contact is about 3000 Å in thickness.

28. An optoelectronic device as defined by claim 4, wherein the at least one contact includes at least one of titanium, platinum, and gold.

29. An optoelectronic device, which comprises:
a semiconductor substrate, the semiconductor substrate including an active surface and a back surface, the back surface opposing the active surface;
at least one light emitting diode junction, the at least one light emitting diode junction being formed on the semiconductor substrate, the at least one light emitting diode junction including a forward bias voltage requirement, the forward bias voltage requirement being less than or equal to about 3.2 volts;
an ultraviolet-curable adhesive layer, the ultraviolet-curable adhesive layer being deposited on at least a portion of the active surface;
an ultraviolet-transparent insulative layer, the ultraviolet-transparent insulative layer being positioned on the ultraviolet-curable adhesive layer, the ultraviolet-curable adhesive layer being cured by passing ultraviolet radiation through the ultraviolet-transparent insulative layer, the ultraviolet-curable adhesive layer bonding the ultraviolet-transparent insulative layer to at least a portion of the active layer in response to being cured; and
electrically conductive material, the electrically conductive material being deposited on the back surface of the semiconductor substrate, the electrically conductive material forming at least one contact, the at least one contact being operatively connected to the at least one light emitting diode junction.

30. An optoelectronic device as defined by claim 4, wherein the semiconductor substrate is silicon.

31. An optoelectronic device as defined by claim 4, further comprising at least one phosphor coating, the at least one phosphor coating being applied to the ultraviolet-transparent insulative layer, thereby enabling light of a selectable color to be emitted from the optoelectronic device.

32. An optoelectronic device as defined by claim 31, wherein the selectable color is substantially white.

33. An optoelectronic device as defined by claim 4, wherein the at least one light emitting diode junction emits light having a wavelength of about 450 nm.

34. An optoelectronic device, which comprises:
a semiconductor substrate, the semiconductor substrate including en active surface and a back surface, the back surface opposing the active surface;
at least one light emitting diode junction, the at least one light emitting diode junction being formed on the semiconductor substrate, the at least one light emitting diode junction including a gallium nitride layer and a P+ layer;
an ultraviolet-curable adhesive layer, the ultraviolet-curable adhesive layer being deposited on at least a portion of the active surface;
an ultraviolet-transparent insulative layer, the ultraviolet-transparent insulative layer being positioned on the ultraviolet-curable adhesive layer, the ultraviolet-curable adhesive layer being cured by passing ultraviolet radiation through the ultraviolet-transparent insulative layer, the ultraviolet-curable adhesive layer bonding the ultraviolet-transparent insulative layer to at least a portion of the active layer in response to being cured;
electrically conductive material, the electrically conductive material being deposited on the back surface of the semiconductor substrate, the electrically conductive material forming a first contact and a second contact;
an isolation trench, the isolation trench being positioned in the active surface of the semiconductor substrate, the semiconductor substrate including a first N+ via and a second N+ via, the isolation trench being positioned between the first N+ via and the second N+ via, the first N+ via being connected to the first contact, the second N+ via being connected to the second contact;
an interconnecting beam, the interconnecting beam operatively connecting the first N+ via of the semiconductor substrate to the P+ layer of the at least one light emitting diode junction;
a P+ contact, the P+ contact being operatively connected to the P+ layer of the at least one light emitting diode junction; and
a shorting ring, the shorting ring operatively connecting the gallium nitride layer of the at least one light emitting diode junction to the second N+ via of the semiconductor substrate, the gallium nitride layer of the at least one light emitting diode junction including a stepped surface, the shorting ring being deposited on the stepped surface.

35. An optoelectronic device as defined by claim 34, further comprising at least one phosphor coating, the at least one phosphor coating being applied to the ultraviolet-transparent insulative layer, thereby enabling light of a selectable color to be emitted from the optoelectronic device.

* * * * *